US005557224A

United States Patent [19]
Wright et al.

[11] Patent Number: 5,557,224
[45] Date of Patent: Sep. 17, 1996

[54] APPARATUS AND METHOD FOR GENERATING A PHASE-CONTROLLED CLOCK SIGNAL

[75] Inventors: Charles G. Wright, Round Rock; Jose M. Alvarez, Leander, both of Tex.

[73] Assignees: International Business Machines Corporation, Armonk, N.Y.; Motorola, Inc., Schaumburg, Ill.

[21] Appl. No.: 228,470

[22] Filed: Apr. 15, 1994

[51] Int. Cl.⁶ .................................................... H03K 21/08
[52] U.S. Cl. .......................... 327/115; 327/117; 327/147; 327/156; 377/48
[58] Field of Search ....................... 327/141, 142, 327/145, 146, 147, 150, 155, 156, 159, 231, 233, 236, 243, 244, 245, 115–117, 119–121; 331/17, 25; 377/48

[56] References Cited

U.S. PATENT DOCUMENTS

| | | | |
|---|---|---|---|
| 3,982,190 | 9/1976 | Schaefer | 327/231 |
| 4,031,317 | 6/1977 | McClain et al. | 328/155 |
| 4,573,176 | 2/1986 | Yeager | 377/48 |
| 4,639,680 | 1/1987 | Nelson | 328/134 |
| 4,696,020 | 9/1987 | Carlach | 377/48 |
| 4,715,050 | 12/1987 | Tanaka et al. | 328/155 |
| 4,757,264 | 7/1988 | Lee et al. | 328/63 |
| 4,896,338 | 1/1990 | Rouillet et al. | 307/262 |
| 4,942,595 | 7/1990 | Baca | 377/48 |
| 5,073,730 | 12/1991 | Hoffman | 328/155 |
| 5,084,907 | 1/1992 | Maemura | 377/48 |
| 5,095,233 | 3/1992 | Ashby et al. | 307/603 |
| 5,111,160 | 5/1992 | Hershberger | 331/1 A |
| 5,142,247 | 8/1992 | Lada, Jr. et al. | 331/25 |
| 5,144,254 | 9/1992 | Wilke | 327/156 |
| 5,161,173 | 11/1992 | Nordby | 328/155 |
| 5,260,979 | 11/1993 | Parker et al. | 331/17 |
| 5,278,520 | 1/1994 | Parker et al. | 331/25 |
| 5,294,894 | 3/1994 | Gebara | 331/25 |
| 5,375,148 | 12/1994 | Parker et al. | 331/17 |
| 5,448,191 | 9/1995 | Meyer | 377/48 |

FOREIGN PATENT DOCUMENTS 0080931  7/1981  Japan ...................................... 377/48

OTHER PUBLICATIONS

"TP 12.1: A 3.3V 0.6um BiCMOS Supescalar Microprocessor", 1994 IEEE Internat'l Solid–State Circuits Conf., IEEE, Feb. 1994, Cat. No. 94CH3410-8, pp. 201–203.

Primary Examiner—Timothy P. Callahan
Assistant Examiner—T. Lam
Attorney, Agent, or Firm—Michael A. Davis, Jr.; Andrew J. Dillon

[57] ABSTRACT

A method and apparatus are provided for generating a phase-controlled clock signal within a microprocessor. A first clock signal having a first frequency is input. After a reset event, the first clock signal transitions in a first direction at a time t. A second clock signal is output having a second frequency related to the first frequency by a non-integer ratio. The second clock signal transitions in the same direction as the first clock signal at time t.

30 Claims, 5 Drawing Sheets

APPARATUS AND METHOD FOR GENERATING A PHASE-CONTROLLED CLOCK SIGNAL

CROSS-REFERENCES TO RELATED APPLICATIONS

The present invention is related to application Ser. No. 08/221,674 having the title "Apparatus and Method for Generating a Clock in a Microprocessor" and bearing attorney docket number AT9-94-016.

BACKGROUND OF THE INVENTION

1. Field of the Invention

The present invention relates to electronic circuitry and, more particularly, to an apparatus and method for generating phase-controlled clock signals.

2. Background Information and Related Art

Microprocessors typically include a conventional phase-lock loop clock generator for generating a processor clock signal in response to an external system clock signal. Preferably, the external system clock signal operates at its maximum possible frequency, as determined largely by the system design. For example, the optimum external system clock frequency may be 66 MHz, while the optimum internal clock frequency of a microprocessor may be 100 MHz, which is one and one-half times the optimum external system clock frequency.

However, conventional phase-lock loop generators cannot operate in a 3:2 mode. That is, they cannot generate an internal processor clock signal that has a 3:2 frequency ratio to the external system clock signal. Therefore, the previously described optimum clock signal frequencies cannot be obtained using conventional phase-lock loop generators. Accordingly, there is a great need for an improved clock regenerator that is capable of performing an n:m frequency ratio of the processor clock signal to the external system clock signal, where n and m are integers other than one.

Furthermore, microprocessors typically include some logic, such as a bus interface unit, that operates at the external system clock frequency. Therefore, there is a great need for an improved clock regenerator that generates and distributes both the previously mentioned high-speed internal processor clock signal and an internal system clock signal throughout the microprocessor. Both of these clocks should be distributed throughout the microprocessor using the same distribution network. Therefore, the improved clock generator should be capable of generating and distributing multiple in-phase clock signals within the microprocessor.

Finally, even if an improved clock regenerator could be implemented, either one of two substantially equal, but 180 degrees out of phase, processor clock signals will be generated each time a reset or power-up event occurs. This event produces testing errors and degrades performance of systems having multiple processors that must operate in synchronization with each other. Accordingly, there is a great need for an improved clock regenerator that generates an internal processor clock signal that is consistently synchronized with the external system clock signal.

SUMMARY OF THE INVENTION

An apparatus and method are provided for generating a phase-controlled clock signal. The method comprises the step of inputting a first clock signal having a first frequency and a first transition direction at a time t. Further, the method comprises outputting a second clock signal having a second frequency related to the first frequency by a ratio, wherein the ratio is not an integer. The second clock signal also has a second transition direction substantially equal to the first transition direction at time t.

The apparatus comprises first circuitry for receiving a first clock signal having a first frequency and a first transition direction at a time t. The apparatus also comprises second circuitry for outputting a second clock signal having a second frequency related to the first frequency by a ratio, wherein the ratio is not an integer. The second clock signal also has a second transition direction substantially equal to the first transition direction at the time t.

The following four paragraphs provide a brief overview of only one embodiment. It should be understood by those skilled in the art that changes in form and detail may be made therein without departing from the spirit and scope of the invention, defined only by the claims.

The frequency of the second clock signal has an n:m ratio to the frequency of the first clock signal. Immediately after a reset event, the first clock signal transitions in a first direction (e.g. positive) at a specific time t.

A phase comparator receives the first clock signal and an internal system clock. The phase comparator compares these signals and produces an output signal. In response to that output signal, a voltage controlled oscillator includes circuitry for generating a third clock signal. However, after the reset event, the third clock signal may transition in a first direction (e.g. positive) at time t, or may transition in the other direction (e.g. negative) at time t. Only one of these transition states is desirable.

Therefore, qualifier logic circuitry generates a gating signal to determine which direction the third clock signal transitions at time t. The qualifier logic circuitry receives two input signals for selecting the n:m ratio and a freezing signal generated by a phase detector. In turn, the qualifier logic circuitry generates two gating signals. Each of these gating signals is in a unique state when the third clock signal transitions in the first direction (e.g. positive) at time t. Similarly, the gating signals are in another unique state when the third clock signal transitions in the second direction (e.g. negative) at time t. Therefore, one of these gating signals is utilized in determining which direction the third clock signal transitions at time t.

The phase detector includes circuitry for receiving the gating signal utilized in determining the transition direction and, in response to the state of that gating signal, generates two selecting signals. A phase selector includes circuitry for receiving the two selecting signals and the third clock signal. Depending on the state of the selecting signals, the phase selector outputs the second clock signal, which is either substantially equivalent to the third clock signal, or is a 180 degree inversion of the third clock signal.

Therefore, it is an object of the present invention to output a processor clock signal having a ratio to the external system clock that is not an integer.

It is a further object to detect the phase of the processor clock signal after a system reset and, if undesirable, invert the processor clock by 180 degrees.

These and other objects, advantages, and features will become even more evident by the following drawings and detailed description.

DETAILED DESCRIPTION OF THE PREFERRED EMBODIMENTS

Figure 1:
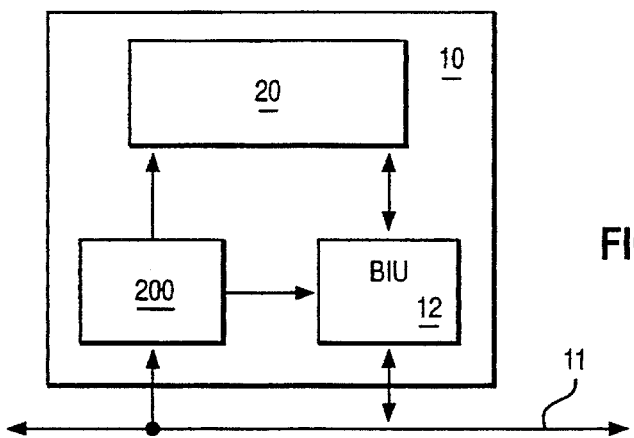
FIG. 1 is a block diagram of a microprocessor for processing information according to the preferred embodiment.

Referring to FIG. 1, the present invention is implemented within microprocessor 10, which is a single integrated circuit superscalar microprocessor. Microprocessor 10 operates according to reduced instruction set computing ("RISC") techniques. However, it should be understood that the present invention can be implemented within other processors and on other hardware platforms.

System bus 11 includes data lines, a system clock line, and a hard reset ("Hreset") line (not shown). The Hreset line and the system clock lines are connected to clock generator 200 of the present invention, while the data lines are connected to bus interface unit ("BIU") 12. The Hreset line goes HIGH and then LOW to initiate a system reset or power-on condition. BIU 12 controls the transfer of information between processor unit 20 and system bus 11. Clock generator 200 generates and distributes an internal processor clock signal to, for example, processor unit 20. Similarly, clock generator 200 generates and distributes an internal system clock signal to, for example, BIU 12. These clock signals are generated in response to the system clock line of system bus 11.

Figure 2:
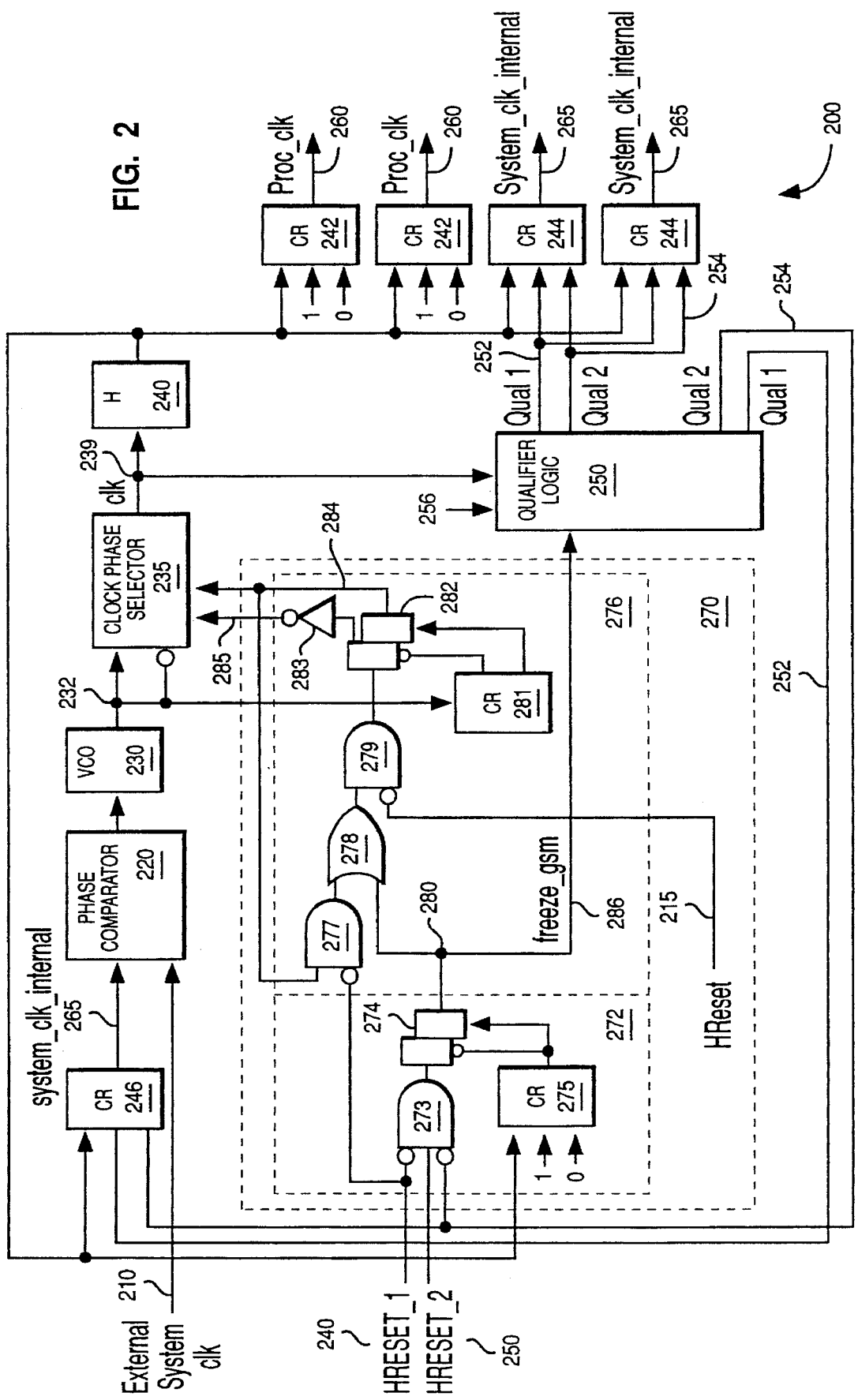
FIG. 2 is a schematic diagram of a phase-lock loop clock generator of the present invention.

FIG. 2 is a schematic diagram of clock generator 200. Clock generator 200 includes phase comparator 220, voltage controlled oscillator ("VCO") 230, clock phase selector ("CPS") 235, H-tree distribution network ("H") 240, multiple clock regenerators ("CR") 242, 244 and 246, qualifier logic ("QL") 250, and phase detector 270.

PHASE COMPARATOR 220

Clock generator 200 generates an internal processor clock signal 260 (i.e. Proc_clk) and an internal system clock signal 265 (i.e. System_clk_internal) in response to external system clock signal 210. To do this, phase comparator 220 receives both System_clk_internal 265 from CR 246 (described herein) and external system clock signal 210 from system bus 11 (see FIG. 1). Phase comparator 220 includes circuitry for generating a DC voltage in response to any variation in phase or frequency between these clock signals.

Illustratively, if the phase of System_clk_internal 265 lags the phase of external system clock signal 210, phase comparator 220 outputs a slightly larger DC voltage. Similarly, if the frequency of System_clk_internal 265 lags the frequency of external system clock signal 210, phase comparator 220 outputs a large DC voltage.

VOLTAGE CONTROLLED OSCILLATOR 230

In turn, VCO 230 includes circuitry for generating a 50% duty cycle, square-wave clock signal 232 having a frequency that is responsive to the voltage output of phase comparator 220. That is, the larger the voltage output of phase comparator 220, the higher the frequency of clock signal 232 generated by VCO 230. Conversely, the smaller the voltage output of phase comparator 220, the lower the frequency of clock signal 232 generated by VCO 230.

In this manner, VCO 230 and phase comparator 220 operate together to ensure that the phase and frequency of System_clk_internal 265 substantially match the phase and frequency of external system clock signal 210 at the input of phase comparator 220. Several iterations may be necessary to substantially match these clock signals.

Figure 3:
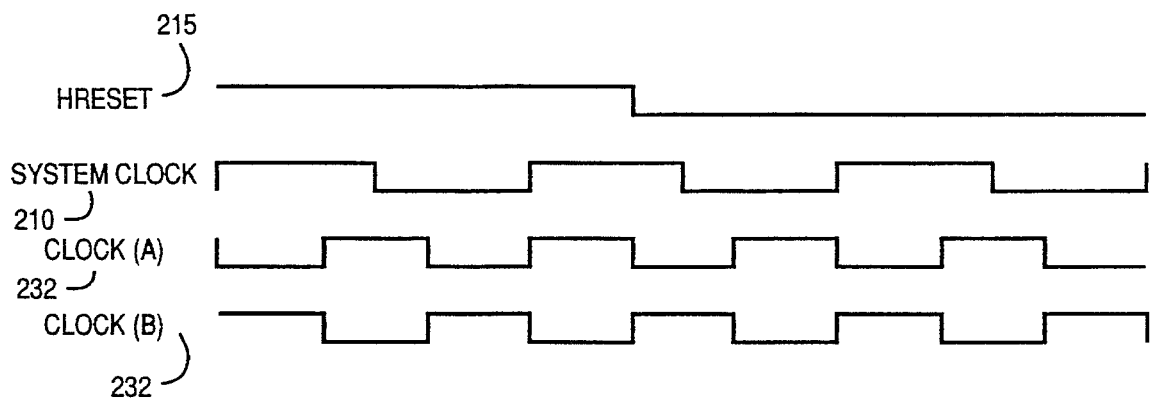
FIG. 3 is a timing diagram showing two possible signals that can be generated by the phase-lock loop clock generator of the present invention.

However, without appropriate correction, clock signal 232 may have either one of two phases after each system power-on or reset event. FIG. 3 illustrates a timing diagram showing the two possible signals that can be generated by VCO 230. Specifically, VCO 230 randomly generates either clock signal (A) 232 or clock signal (B) 232 after each reset event. Immediately after Hreset 215 transitions LOW, clock signal (B) 232 transitions LOW as external system clk 210 transitions HIGH. Conversely, immediately after Hreset 215 transitions LOW, clock signal (A) 232 transitions HIGH as external system clk 210 transitions HIGH.

In the preferred embodiment, the phase of clock signal (A) 232 is the desired phase. Accordingly, the following disclosure describes correcting the phase of undesirable clock signal (B) 232. Alternately, the phase of clock signal (B) 232 could be selected as the desirable phase.

Referring to FIGS. 2 and 3, if VCO 230 generates clock signal (B) 232, CPS 235, phase selector 270, and QL 250 operate together to "flip" or invert the phase of clock signal (B) 232 by 180 degrees. That is, CPS 235 generates clock ("clk") signal 239 having substantially the same frequency and phase as clock signal (A) 232 (see FIG. 3). However, if VCO generates clock signal (A) 232, that signal simply passes through CPS 235 unaltered.

GENERATING HRESET 1 240 AND HRESET 2 250

Figure 4:
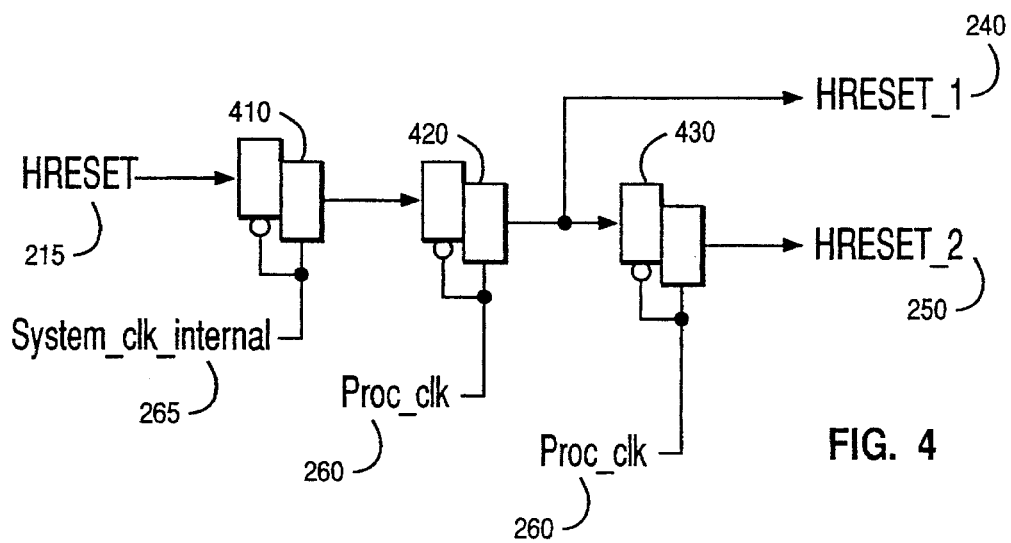
FIG. 4 is a schematic diagram of the latches used to generate two reset signals.

As previously described, during a reset or power-on event, an Hreset line (i.e. Hreset 215) transitions HIGH and then LOW. FIG. 4 illustrates a schematic diagram of the latches used to generate two reset signals from Hreset 215. Specifically, three sets of master/slave latches 410, 420, and 430 synchronize Hreset 215 to various clock signals. These latches are triggered on the rising edge of those clock signals.

Specifically, master/slave latch 410 synchronizes Hreset 215 to System_clk_internal 265. The output of latch 410 is then synchronized to Proc_clk 260 to generate Hreset_1 240. Further, the output of latch 420 is synchronized to Proc_clk 260 to generate Hreset_2 250.

Figure 5:
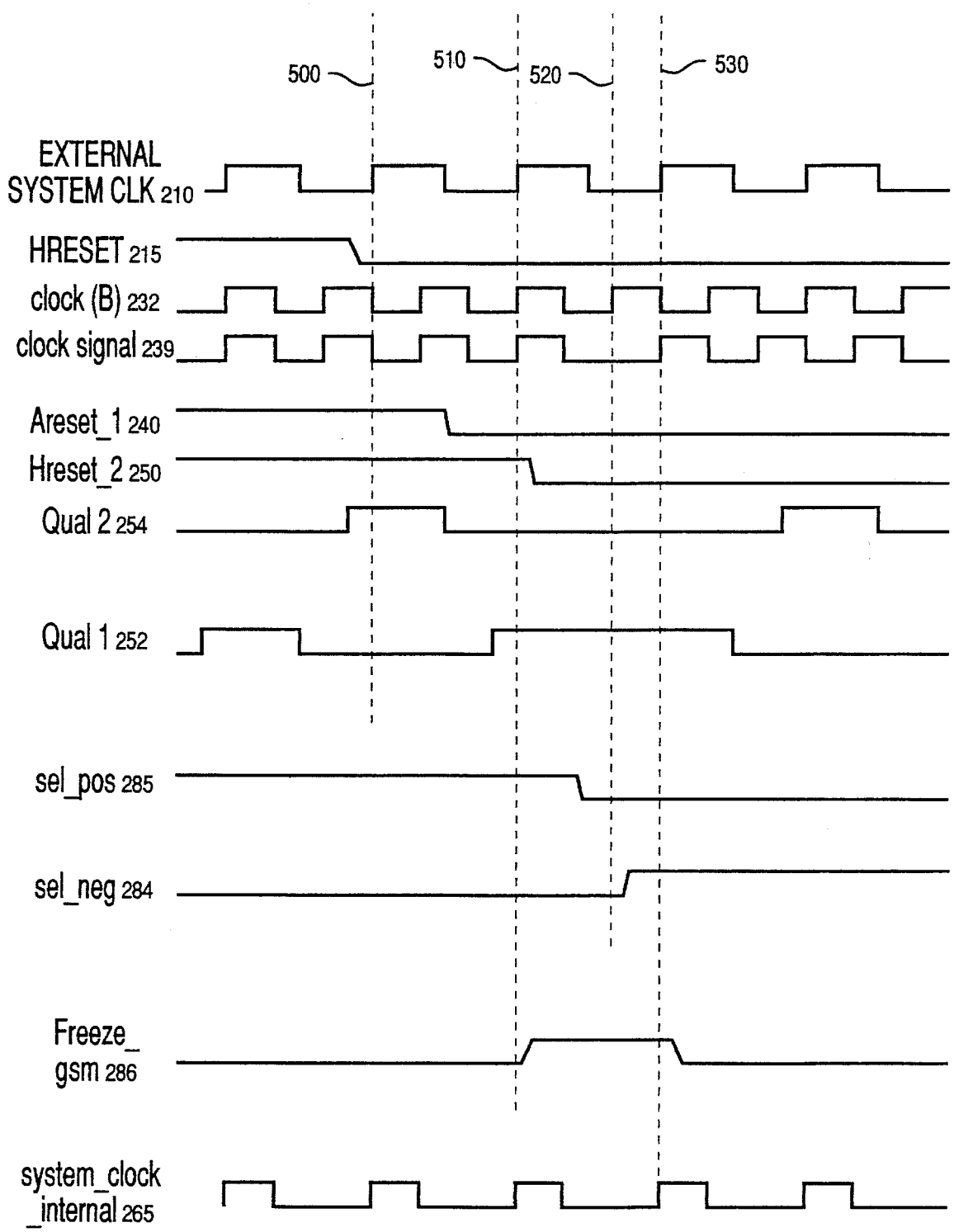
FIG. 5 is a timing diagram in accordance with the present invention.

To better describe these signals, please refer to FIG. 5, which illustrates a timing diagram during and, immediately after, a system power-on or reset condition for clock regenerator 200 in a 3:2 mode. Reference is specifically made to Hreset 215, Hreset_1 240, Hreset_2 250, and external system clock 210.

PHASE DETECTOR 270 FOR GENERATING SEL POS AND SEL NEG

Again referring to FIG. 2, phase detector 270 includes input circuitry 272 and output circuitry 276 for generating selecting signals sel_pos 285 and sel_neg 284. Input circuitry 272 includes master/slave latch 274, CR 275, and AND gate 273 for "ANDING" three signals, namely inverted Hreset_1 240, Hreset_2 250, and an inverted gating signal Qual2 254 (described herein). Therefore, for the output of AND gate 273 to go HIGH, Hreset_1 240 must be LOW, Hreset_2 250 must be HIGH, and Qual2 254 must be LOW. When these conditions occur, AND gate 275 generates a pulsed output signal. Shortly thereafter, master/slave latch 274 latches that pulsed output signal.

CR 275 regenerates Proc_clk 260 to trigger master/slave latch 274 on the edges of Proc_clk 260. As such, during negative cycles of Proc_clk 260, the master latch opens and the slave latch latches the output of AND gate 273, thereby generating freeze_qsm signal 286 (see FIG. 5) at node 280. Conversely, during positive cycles of Proc_clk 260, the master latch latches the output of AND gate 273 and the slave latch opens.

Output circuitry 276 includes AND gates 277 and 279, OR gate 278, master/slave latch 282, invertor 283, and CR 281. Output circuitry 276 generates selecting signals sel_pos 285 and sel_neg 284.

AND gate 277 "ANDs" sel_neg 284 and inverted Hreset_1 240. In turn, OR gate 278 "ORs" the output of AND gate 277 and freeze_qsm signal 286. AND gate 279 "ANDs" the output of OR gate 278 and an inverted Hreset 215 which, in turn, is latched by master slave latch 282. CR 281 regenerates and distributes clock signal 232 to master/slave latch 282. As such, during negative cycles of that clock, the master latch opens and the slave latch latches the output of AND gate 279 to generate selecting signal sel_neg 284. Conversely, during positive cycles of that clock, the slave latch opens and the master latch latches the output of AND gate 279, which is inverted by invertor 283 to generate selecting signal sel_pos 285.

Consequently, if freeze_qsm signal 286 is HIGH, master/slave latch 282 will eventually latch sel_pos 285 LOW and sel_neg 283 HIGH (see FIG. 5). Once a reset event occurs, AND gate 277 maintains sel_neg 284 in the HIGH state and sel_neg in the LOW state until another reset event occurs.

DISCUSSION OF THE TIMING DIAGRAM

Reference is made to FIGS. 2 and 5. FIG. 5 shows external system clock signal 210, Hreset 215, clock signal (B) 232, clk signal 239, Hreset_1 240, Hreset_2 250, gating signals Qual2 254 and Qual1 252, selecting signals sel_pos 285 and sel_neg 284, freeze_qsm 286, and System_clk_internal 265.

Immediately after Hreset 215 transitions LOW, the first leading edge of external system clk 210 occurs at time 500. At time 500, clock signal (B) 232 transitions LOW at the same time external system clock 210 transitions HIGH. However, the actual detection of clock signal (B) 232 occurs at time 510. At time 510, Qual2 254 is LOW and Qual1 252 is HIGH. However, if clock signal (A) 232 (see FIG. 4) had been generated instead of clock signal (B) 232, Qual2 254 would have been HIGH at time 510.

Therefore, in the preferred embodiment, Qual2 254 is utilized to indicate the phase of the output of VCO 230. Specifically, if Qual2 254 is HIGH, AND gate 273 will always generate a LOW. Conversely, if Qual2 254 is LOW, AND gate 273 may generate a HIGH.

For example, at time 510, Hreset_1 240 is latched LOW, Hreset_2 250 is latched HIGH, and Qual2 254 is LOW. Consequently, AND gate 273 (see FIG. 2) causes freeze_qsm 286 to go HIGH shortly thereafter and remain HIGH until clk signal 239 transitions HIGH at time 530.

As previously described, the phase of clock signal (B) 232 is undesirable because, at time 500, it transitions LOW when external system clk 210 transitions HIGH. Therefore, the phase of undesirable clock signal (B) 232 must be "flipped" or inverted by 180 degrees. To do this, a clock phase selector must be utilized.

CLOCK PHASE SELECTOR 235

Figure 6:
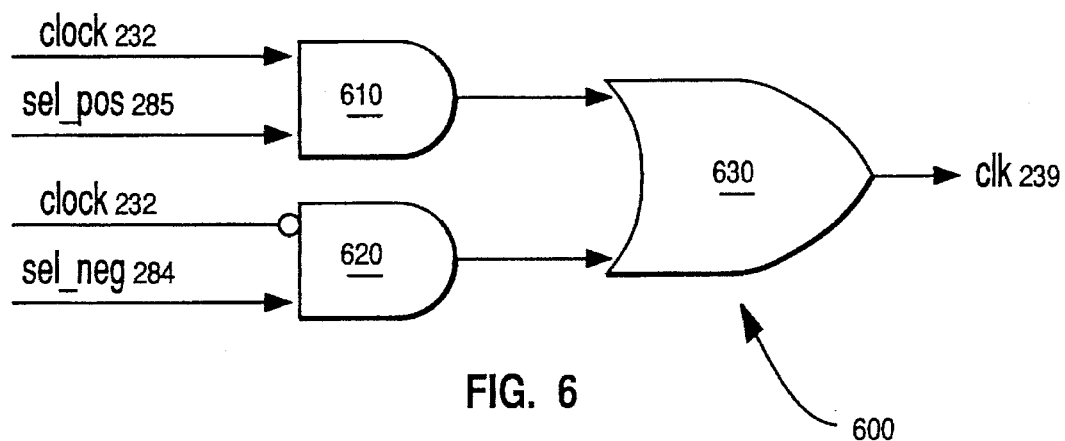
FIG. 6 is a schematic diagram of the circuitry for the clock phase selector of the present invention.

FIG. 6 is a schematic diagram of the circuitry for clock phase selector ("CPS") 235. CPS 235 includes AND gate 610 for receiving clock signal (B) 232 and selecting signal sel_pos 285. CPS also includes AND gate 620 for receiving an inverted clock signal (B) 232 and selecting signal sel_neg 284. In turn, OR gate 630 "ORs" the outputs of AND gates 610 and 620 to generate clk signal 239.

To better describe the functionality of CPS 235, please refer to FIGS. 5 and 6. Between times 500 and 520, CPS 235 generates clk signal 239, which is substantially identical to clock signal (B) 232 because selecting signal sel_pos 285 is HIGH and selecting signal sel_neg 284 is LOW.

However, at time 520, even though clock signal (B) 232 transitions HIGH, clk signal 239 remains LOW because sel_pos 285 is LOW. Shortly thereafter, sel_neg 284 transitions HIGH, while sel_pos 285 remains LOW. As a result, clk signal 239 is 180 degrees out of phase with clock signal (B) 232, beginning at time 530 and continuing thereon until another reset or power-on event OCCURS.

It is important to note that if VCO generates clock signal (A) 232, that signal simply passes through CPS 235 unaltered because sel_pos 285 is HIGH and sel_neg 284 is LOW.

QUALIFIER LOGIC 250 FOR GENERATING QUAL1 252 AND QUAL2 254

Figure 7:
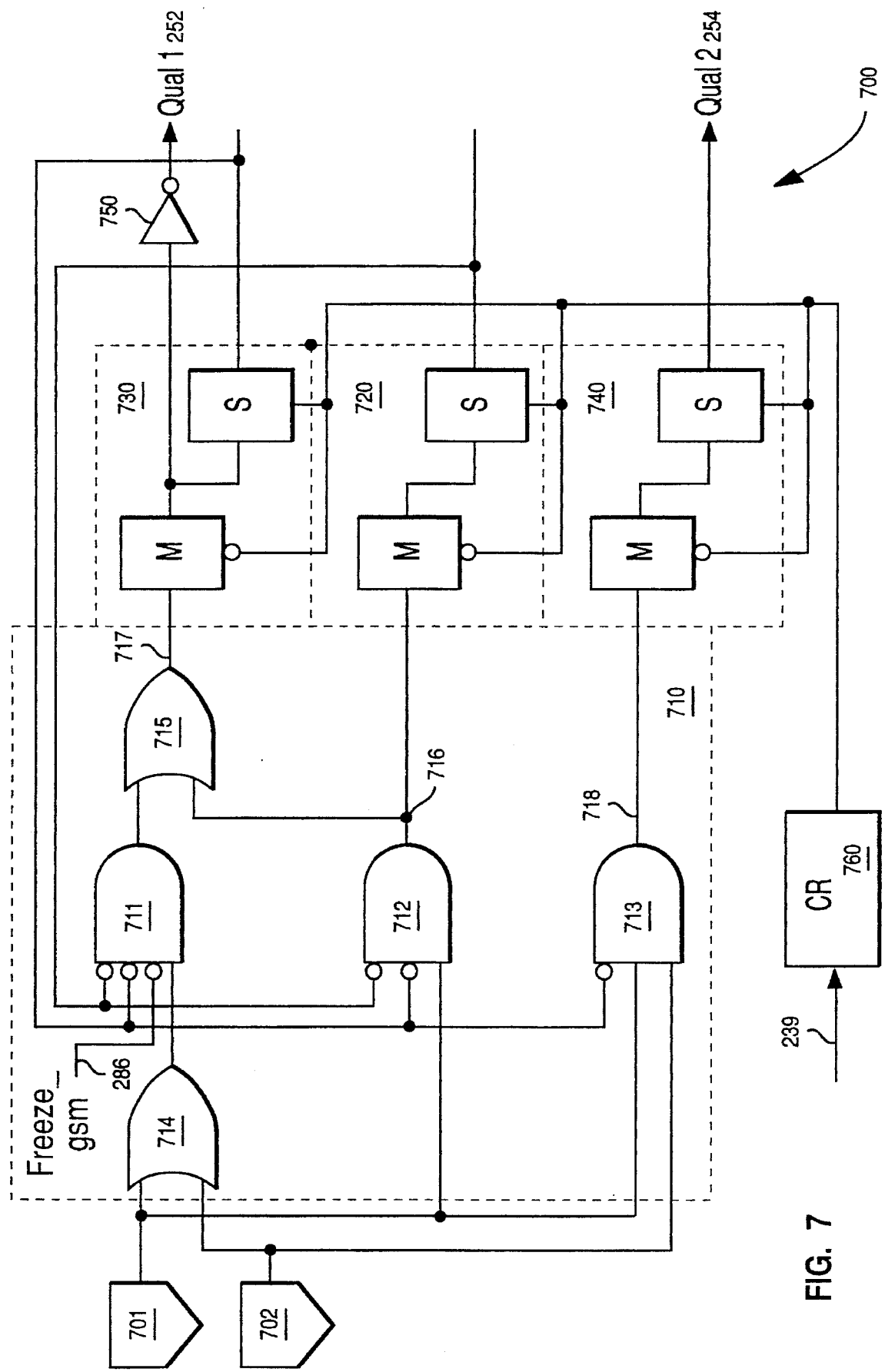
FIG. 7 is a schematic diagram of the circuitry for the qualifier logic of the present invention.

FIG. 7 is a schematic diagram of qualifier logic 250 for generating two gating signals Qual1 252 and Qual2 254. QL 250 includes circuit 700 for generating multiple gating signals Qual1 252 and Qual2 254. Circuit 700 includes input circuitry 710, master/slave latches 720, 730, and 740, invertor 750, and clock regenerator 760. Input circuitry 710 includes AND gates 711–713 and OR gates 714–715. Clock regenerator 760 regenerates and distributes clk signal 239 to master/slave latches 720, 730, and 740. As such, during negative cycles of that clock, the master latch opens and the slave latch latches. Conversely, during positive cycles of that clock, the master latch latches and the slave latch opens. Latches 720, 730, and 740 are triggered on the edges of clk signal 239.

Input circuitry 710 receives freeze_qsm signal 286 from phase detector 270 (see FIG. 2) and a user-defined n:m frequency ratio of the processor clock signal to the external system clock signal. Ratio select input 256 (see FIG. 2) includes a set of input pins 701 and 702 for defining the desired n:m frequency ratio. For example, strapping or applying zeros (i.e. "0, 0") to pins 701 and 702 corresponds to a 1:1 ratio, applying "0, 1" to pins 701 and 702, respectively, corresponds to a 2:1 ratio, "1, 0" corresponds to a 3:1 ratio, and "1, 1" corresponds to a 3:2 ratio. Alternately, additional pins could be provided to specify other ratios.

In response to the user-defined ratio, freeze_qsm signal 286, and the phase/frequency of clk signal 239 (i.e. Proc_clk 260), input circuitry 710 generates three output signals 716–718. Output signal 716 is latched by master/slave latch 720 and then fed back to input circuitry 710. Output signal 717 is latched by the master latch of master/slave latch 730 and then inverted by invertor 750 to generate gating signal Qual1 252. The slave latch of master/slave latch 730 latches the previously latched signal from its master latch, which is then fed back to input circuitry 710. Finally, output signal 718 is latched by master/slave latch 740 to generate gating signal Qual2 254.

In sum, circuit 700 receives freeze_qsm signal 286, the n:m ratio, and clk signal 239 and, in response, generates gating signals Qual1 252 and Qual2 254.

To better described the function of circuit 700, please refer to FIGS. 5 and 7. Clk signal 239 (i.e. Proc_clk 260)

has a frequency of 1.5 times the frequency of external system clock signal 210. Before time 510, Qual1 252 and Qual2 254 are shown under normal system operation (i.e. no reset or power-on condition) for a 3:2 mode. Under normal system operation, freeze_qsm 286 is LOW and, thus, has no effect on Qual1 252 and Qual2 254 (see FIG. 7).

However, after time 510, freeze_qsm 286 transitions HIGH for the period of time that clk signal 239 is inverted. Clk signal 239 stabilizes at time 530 and, therefore, freeze_qsm 286 transitions LOW. During that period of time, AND gate 711 causes Qual1 252 to remain HIGH and Qual2 254 to remain LOW (see FIG. 7). This keeps System_clk_internal 265 in phase with external system clock 210 during the time clk signal 239 is flipped.

H-TREE DISTRIBUTION NETWORK 240

Referring again to FIG. 2, H 240 distributes clk signal 239 to multiple nodes throughout the microprocessor. Each node is equidistant from VCO 230 and includes one of multiple CRs 242, 244, or 246. However, it should be understood that other distribution networks may be used to distribute clk signal 239 throughout the microprocessor. CRs 244 and 246 receive gating signals Qual1 252 and Qual2 254 to generate System_clk_internal 265 (described herein).

CLOCK REGENERATORS

Figure 8:
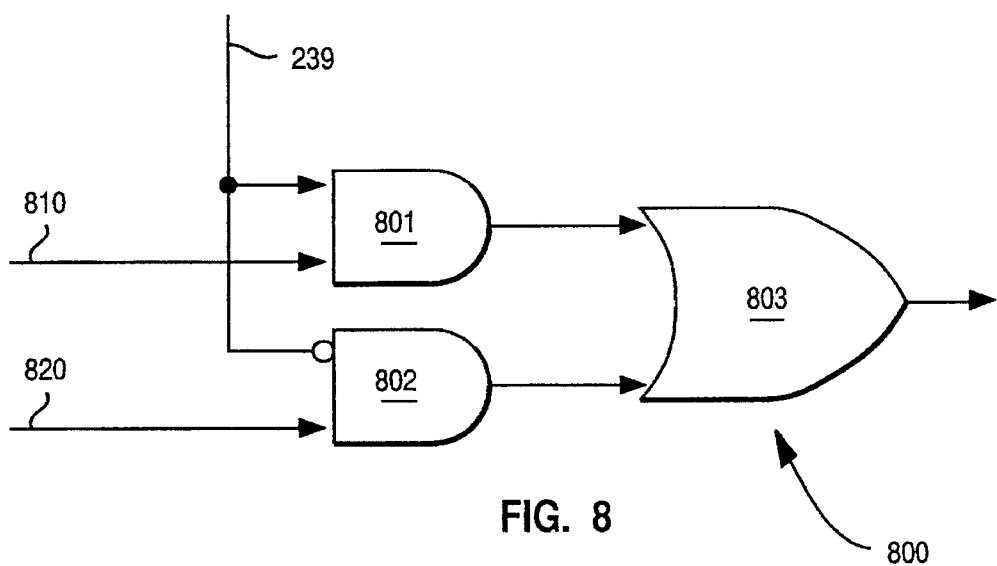
FIG. 8 is a schematic diagram of the input circuitry for clock regenerators of the present invention.

FIG. 8 is a schematic diagram of the input circuitry for the clock regenerators ("CR"). Referring to FIGS. 2 and 8, each CR 242, 244, 246, 275, 281, and 760 (see FIG. 7) includes input circuitry 800 for generating either Proc_clk 260 or System_clk_internal 265. These clock are generated in response to clk signal 239 and the signals applied at inputs 810 and 820.

To generate System_clk_internal 265, inputs 810 and 820 of CR 244 and 246 receive Qual1 252 and Qual2 254, respectively. Gate 801 "ANDS" clk signal 239 and Qual1 252, while gate 802 "ANDS" Qual2 254 and an inverted clk signal 239. In turn, gate 803 "ORS" the outputs of gates 801 and 802 to generate System_clk_internal 265.

System_clk_internal 265 is substantially in phase and frequency with external system clock signal 210, albeit having a different duty cycle. That is, the positive-going edge of each System_clk_internal 265 substantially matches the positive-going edge of external system clock signal 210 (see FIG. 5).

To generate Proc_clk 260, inputs 810 and 820 of CRs 242 and 275 are held at a constant "1" and "0", respectively. As a result, CRs 242, 275, 281, and 760 generates Proc_clk 260, which is substantially equivalent in phase and frequency to clk signal 239.

Alternately, for ratios larger than 3:2 (e.g. 4:3, 5:4), QL 250 could generate two additional gating signals (not shown) to be applied at inputs 810 and 820.

SUMMARIZING THE FUNCTIONALITY OF QL 250 AND CLOCK REGENERATORS

QL 250 operates with each CR 244 and 246 to multiply Proc_clk 260 by a factor of "n" (e.g. 1, 2, or 3) and then divide the resultant by a factor of "m" (e.g. 1 or 2) to produce System_clk_internal 265. To do this, QL 250 generates Qual1 252 and Qual2 254 in response to clk signal 239 and the user-defined n:m ratio. Next, each input circuitry 800 of each CR 244 and 246 generates System_clk_internal 265 in response to clk signal 239, Qual1 252, and Qual2 254.

The output of CR 246 (i.e. System_clk_internal-265) is fed back to phase comparator 220. Because phase comparator 220 and VCO 230 ensure that System_clk_internal 265 has substantially the same frequency/phase as external system clock signal 210, VCO 230 eventually outputs clock signal 232 having a frequency that is n/m times the frequency of external system clock signal 210.

While the invention has been shown and described with reference to particular embodiments thereof, it will be understood by those skilled in the art that the foregoing and other changes in form and detail may be made therein without departing from the spirit and scope of the invention. For example, QL 250 could generate additional gating signals to be applied to clock regenerators 244, thereby permitting a larger ratio (e.g. 4:3, 5:4, etc.) between the frequency of Proc_clk 260 and the frequency of external system clock signal 210.

Figure 9:
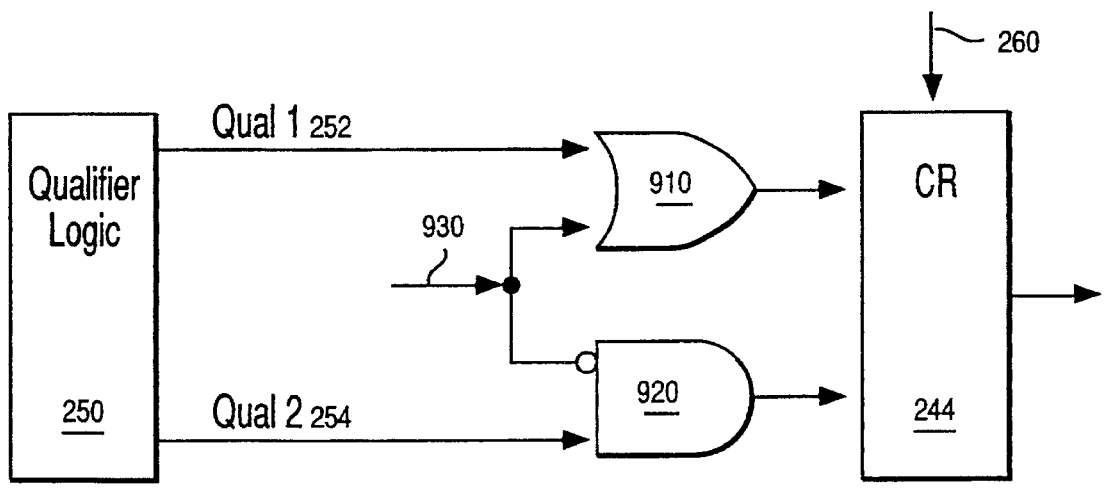
FIG. 9 is a schematic diagram of circuitry for producing a processor clock instead of an external system clock.

Furthermore, during any desired period of time, CRs 244 could generate Proc_clk 260 instead of System_clk_internal 265. To do this, refer to FIG. 9, which illustrates circuit 900. Circuit 900 includes OR gate 910 for "ORING" Qual1 252 and an input signal 930, and AND gate 920 for "ANDING" Qual2 254 and an inverted input signal 930. As such, when input signal 930 is LOW, OR gate 910 regenerates Qual1 252 and AND gate 920 regenerates Qual2 254. However, when input signal 930 is HIGH, OR gate 910 generates a HIGH and OR gate 920 generates a LOW. As a result, when input signal 930 is HIGH, CR 244 regenerates Proc_clk 260.

I claim:

1. A method of generating a phase-controlled clock signal, comprising the steps of:

inputting a first clock signal having a first frequency and a first transition direction at a time t;

outputting a second clock signal having a second frequency related to said first frequency by a non-integer ratio, said second clock signal having a second transition direction at said time t;

detecting whether said second transition direction is substantially equal to said first transition direction at said t; and in response to said detecting step, selectively inverting said second clock signal.

2. The method according to claim 1 wherein said time t occurs after a reset event.

3. The method according to claim 1 wherein said second frequency is related to said first frequency by said ratio of n:m, where n and m are integers other than one.

4. The method according to claim 2, wherein said step of selectively inverting comprises the steps of:

when said second transition direction is not substantially equal to said first transition direction, inverting said second clock signal to generate a third clock signal; and when said second transition direction is substantially equal to said first transition direction, generating said third clock signal, wherein said third clock signal is substantially equal to said second clock signal.

5. The method according to claim 4 wherein said first clock signal comprises a system clock signal.

6. The method according to claim 3 further comprising the steps of:

inputting at least one signal indicating said non-integer ratio; and generating at least one gating signal in response to said third clock signal and said ratio, said at least one gating signal having a first logic state and a second logic state.

7. The method according to claim 6 further comprising the step of:

in response to said at least one gating signal and said third clock signal, generating an internal system clock signal at said first frequency.

8. The method according to claim 7 wherein said step of outputting said second clock signal comprises the steps of:

generating an output signal corresponding to the difference in phase between said internal system clock signal and said system clock signal; and generating said second clock signal in response to said output signal.

9. The method according to claim 8 wherein said reset event comprises the following step:

inputting a hard reset signal;

generating a first and second reset signal from said hard reset signal, each having a first and second logic state.

10. The method according to claim 9 wherein said step of detecting whether said second transition direction is substantially equal to said first transition direction at time t comprises the steps of:

in response to said gating signal and said first and second reset signals, generating a freeze signal having first and second logic states; and in response to said gating signal and said first and second reset signals, generating first and second selecting signals, each having first and second logic states.

11. The method according to claim 10 further comprising the steps of:

when said first reset signal is in said first logic state, then said first selecting signal is in said first logic state, said second selecting signal is in said second logic state, and said freeze signal is in said second logic state; and when said first reset signal and said gating signal are in said second logic state and said second reset signal is in said first logic state, then said first selecting signal transitions to said second logic state, said second selecting signal transitions to said first logic state, and said freeze signal transitions to said first logic state.

12. The method according to claim 11 further comprising the step of:

holding said gating signal in its current logic state when said freezing signal is in said first logic state.

13. The method according to claim 12 wherein said step of generating said third clock signal comprises the steps of:

in response to said first selecting signal being in said first logic state and said second selecting signal being in said second logic state, generating said third clock signal, which is substantially equal to said second clock signal; and in response to said first selecting signal being in said second logic state and said second selecting signal being in said first logic state, inverting said second clock signal to generate said third clock signal.

14. The method according to claim 13 further comprising the step of distributing said third clock signal and said internal system clock signal throughout a processor.

15. The method according to claim 14 wherein said first logic state is a "1" and said second logic state is a "0".

16. An apparatus for generating a phase-controlled clock signal, comprising:

first circuitry for receiving a first clock signal having a first frequency and a first transition direction at a time t and for outputting a second clock signal having a second frequency related to said first frequency by a non-integer ratio, said second clock signal having a second transition direction at said time t;

a phase detector for detecting whether said second transition direction is substantially equal to said first transition direction at said time t; and in response to detecting whether said second transition direction is substantially equal to said first transition direction, second circuitry for selectively inverting or not inverting said second clock signal, thereby generating a third clock signal.

17. The apparatus according to claim 16 wherein said time t occurs after a reset event.

18. The apparatus according to claim 16 wherein said second frequency is related to said first frequency by said ratio of n:m, where n and m are integers other than one.

19. The apparatus according to claim 16 wherein said first clock signal comprises a system clock signal.

20. The apparatus according to claim 19 further comprising:

qualifier logic circuitry for receiving at least one signal indicating said non-integer ratio; and said qualifier logic circuitry for outputting at least one gating signal in response to said third clock signal and said ratio, said gating signal having a first logic state and a second logic state.

21. The apparatus according to claim 20 further comprising:

clock regenerator circuitry for receiving said gating signal and said third clock signal; and in response to said gating signal and said third clock signal, said clock regenerator circuitry for generating an internal system clock signal at said first frequency.

22. The apparatus according to claim 21 further comprising a distribution network for distributing said third clock signal and said internal system clock signal throughout a processor.

23. The apparatus of claim 22 wherein said first logic state is a "1" and said second logic state is a "0".

24. The apparatus according to claim 21 wherein said first circuitry comprises:

a phase comparator for receiving said system clock signal and said internal system clock signal;

said phase comparator for generating an output signal corresponding to the difference in phase between said internal system clock signal and said system clock signal; and an oscillator for generating said second clock signal in response to said output signal.

25. The apparatus according to claim 24 further comprising:

a plurality of latches for inputting a hard reset signal and outputting first and second reset signals, each of said reset signals having a first and second logic state; and said first and second reset signals for identifying said reset event.

26. The apparatus according to claim 28 wherein said phase detector comprises:

in response to said gating signal and said first and second reset signals, input circuitry for generating a freeze signal having a first and second logic state;

in response to said freeze signal, output circuitry for generating first and second selecting signals, each having first and second logic states.

when said freeze signal transitions to said first logic state, said first selecting signal transitions to said second logic state and said second selecting signal transitions to said first logic state; and when said freeze signal transitions to said second logic state, said first selecting signal remains in its current logic state and said second selecting signal remains in its current logic state.

27. The apparatus according to claim 26 wherein said second circuitry comprises:

a phase selector for receiving said second clock signal and said first and second selecting signals;

in response to said first selecting signal being in said first logic state and said second selecting signal being in said second logic state, said phase selector for outputting said third clock signal, which is substantially equal to said second clock signal; and in response to said first selecting signal being in said second logic state and said second selecting signal being in said first logic state, said phase selector for outputting said third clock signal having a third transition direction substantially equal to said first transition direction at said time t.

28. The apparatus according to claim 26 wherein said freezing signal holds said gating signal in its current logic state when said freezing signal is in said first logic state.

29. The apparatus according to claim 26 wherein said phase detector further comprising the steps of:

when said first reset signal is in said first logic state, than said first selecting signal is in said first logic state, said second selecting signal is in said second logic state, and said freeze signal is in said second logic state; and when said first reset signal and said gating signal are in said second logic state and said second reset signal is in said first logic state, then said first selecting signal transitions to said second logic state, said second selecting signal transitions to said first logic state, and said freeze signal transitions to said first logic state.

30. A method of generating a phase-controlled clock signal, comprising the steps of:

inputting a first clock signal having a first frequency and a first transition direction at a time t;

outputting a second clock signal having a second frequency related to said first frequency by a non-integer ratio;

detecting whether said second transition direction is not equal to said first transition direction at said time t; and in response to said detecting step, selectively inverting said second clock signal.

\* \* \* \* \*

UNITED STATES PATENT AND TRADEMARK OFFICE
CERTIFICATE OF CORRECTION

PATENT NO. : 5,557,224
DATED : September 17, 1996
INVENTOR(S) : Wright et al.

It is certified that error appears in the above-indentified patent and that said Letters Patent is hereby corrected as shown below:

Column 4, line 26: change "elk" to --clk--

Signed and Sealed this

Seventeenth Day of December, 1996

Attest:

BRUCE LEHMAN

*Attesting Officer*  *Commissioner of Patents and Trademarks*